United States Patent
Kim et al.

(10) Patent No.: US 12,319,705 B2
(45) Date of Patent: Jun. 3, 2025

(54) RUTHENIUM PRECURSOR COMPOSITION, PREPARATION METHOD THEREFOR, AND FORMATION METHOD FOR RUTHENIUM-CONTAINING FILM USING SAME

(71) Applicant: UP CHEMICAL CO., LTD., Pyeongtaek-si (KR)

(72) Inventors: Yun Tae Kim, Pyeongtaek-si (KR); Won Seok Han, Pyeongtaek-si (KR); Yoon A Park, Pyeongtaek-si (KR); Wonyong Koh, Pyeongtaek-si (KR)

(73) Assignee: UP CHEMICAL CO., LTD., Pyeongtaek-si (KR)

( * ) Notice: Subject to any disclaimer, the term of this patent is extended or adjusted under 35 U.S.C. 154(b) by 0 days.

(21) Appl. No.: 18/854,563

(22) PCT Filed: Mar. 30, 2023

(86) PCT No.: PCT/KR2023/004278
§ 371 (c)(1),
(2) Date: Oct. 7, 2024

(87) PCT Pub. No.: WO2023/200154
PCT Pub. Date: Oct. 19, 2023

(65) Prior Publication Data
US 2025/0129111 A1     Apr. 24, 2025

(30) Foreign Application Priority Data
Apr. 12, 2022 (KR) .................. 10-2022-0045414

(51) Int. Cl.
*C23C 16/18* (2006.01)
*C07F 15/00* (2006.01)
*C23C 16/455* (2006.01)

(52) U.S. Cl.
CPC .... *C07F 15/0046* (2013.01); *C23C 16/45553* (2013.01)

(58) Field of Classification Search
CPC ... C23C 16/18; C23C 16/06; C23C 16/45553; C09D 1/00; C07F 15/0046
USPC ...................................................... 252/513
See application file for complete search history.

(56) References Cited

U.S. PATENT DOCUMENTS 9,957,614 B2 * 5/2018 Han ..................... C09D 1/00
2017/0226638 A1    8/2017 Han

FOREIGN PATENT DOCUMENTS

| JP | 2007-169725 A | 7/2007 |
| KR | 10-2009-0082543 A | 7/2009 |
| KR | 10-2010-0060482 A | 6/2010 |
| KR | 10-2015-0137962 A | 12/2010 |
| KR | 10-2021-0148408 A | 12/2021 |
| WO | 2020223038 A1 | 11/2020 |

OTHER PUBLICATIONS

L. G. Wen et al., Ruthenium Metallization for Advanced Interconnects, IEEE International Interconnect Technology Conference/Advanced Metallization Conference (IITC/AMC), (2016).
Y. M. Wuu et al., Thermal Reactions of Ru(CO)3(C2H4)2 with Acrylic, Non-Conjugated Dienes and Photochemistry of Ru(CO)4(eta squared-diene) Complexes, Inorganic Chemistry, 27(17); 3039-3044 (1988).
International Search Report from International Application No. PCT/KR2023/004278 mailed Jul. 11, 2023.

* cited by examiner

*Primary Examiner* — Charanjit Aulakh
(74) *Attorney, Agent, or Firm* — Shih IP Law Group, PLLC.

(57) ABSTRACT

A compound represented by chemical formula 4 is reacted with an alkali metal carbonate salt represented by chemical formula 5 and 1,5-hexadiene, in an organic solvent, and by controlling a compound represented by chemical formula 1, a compound represented by chemical formula 2 and a compound represented by chemical formula 3 to within a specific content range, a ruthenium precursor composition that is thermally very stable is provided in an economical and efficient manner. When a ruthenium-containing film is formed by using the ruthenium precursor composition, changes in the composition of the ruthenium precursor composition is prevented during a process in which the ruthenium precursor composition is vaporized, or even thereafter, production of by-products such as pyrolysis substances or the like is minimized, and accordingly, deposition results having stable and constant properties is obtained in a semiconductor process.

22 Claims, 2 Drawing Sheets

RUTHENIUM PRECURSOR COMPOSITION, PREPARATION METHOD THEREFOR, AND FORMATION METHOD FOR RUTHENIUM-CONTAINING FILM USING SAME

CROSS-REFERENCE TO RELATED APPLICATIONS

This Application is a U.S. national phase application under 35 U.S.C. § 371 of PCT Application No. PCT/KR2023/004278 filed on Mar. 30, 2023, which claims the benefit of Korean Patent Application No. 10-2022-0045414 filed on Apr. 12, 2022, the entire disclosures of which are incorporated herein by reference.

TECHNICAL FIELD

The present invention relates to a ruthenium precursor composition, a method for preparing the same, and a method for forming a ruthenium-containing film using the same.

BACKGROUND ART

Since ruthenium (Ru) metal has a low resistivity ($\rho_{bulk}$=7.6 μΩ·cm) and a large work function ($\Phi_{bulk}$=4.71 eV), it may be used as a gate electrode of a transistor; or as a capacitor electrode material of dynamic random access memory (DRAM) or ferroelectric random access memory (FeRAM). In particular, since ruthenium (Ru) metal conducts electricity well like copper (Cu), tungsten (W), and cobalt (Co), it may be used as a wiring material for semiconductor devices.

In general, as the integration of semiconductor devices progresses and the width of metal wiring becomes narrower, the resistance of the metal wiring may increase. However, if ruthenium metal is used for the wiring of a semiconductor device having a very narrow metal wiring width (wiring width of about 40 nm or less), the ruthenium (Ru) metal increases resistance less than copper or cobalt; thus, it can be advantageously used as a next-generation wiring material.

Meanwhile, in order to fill the narrow grooves required for the wiring of next-generation semiconductor devices with ruthenium metal, it is advantageous to supply a gaseous ruthenium compound to the surface of a substrate to form a ruthenium-containing film by chemical vapor deposition (CVD) or atomic layer deposition (ALD).

For this purpose, various ruthenium precursor compositions that can be used for CVD or ALD have recently been developed.

However, when such a ruthenium precursor composition is applied to a semiconductor device, the ruthenium precursor composition may change during the vaporization process or over time, and it may be thermally unstable, resulting in the formation of by-products such as thermal decomposition materials. As a result, there would be a serious problem in that stable and constant deposition results cannot be obtained in the semiconductor process, and reproducibility cannot be guaranteed.

Accordingly, there is a need to develop a ruthenium precursor composition that is thermally stable, so that it would not easily change in its composition even at the vaporization temperature, and can minimize the formation of by-products.

PRIOR ART DOCUMENTS

Non-Patent Documents (Non-patent document 1) L. G. Wen et al., "Ruthenium metallization for advanced interconnects," 2016 IEEE International Interconnect Technology Conference/Advanced Metallization Conference (IITC/AMC), doi: 10.1109/iitc-amc.2016.7507651, 2016.

(Non-patent document 2) Y. M. Wuu et al., Inorganic Chemistry 1988, 27(17), 3039-3044, doi: 10.1021/ic00290a028.

DISCLOSURE OF INVENTION

Technical Problem

An object of the present invention is to provide a ruthenium precursor composition that is thermally stable, so that it would not easily change in its composition even at the vaporization temperature, and can minimize the formation of by-products such as thermal decomposition materials.

Another object of the present invention is to provide a method for preparing a ruthenium precursor composition, which is thermally stable, so that it would not easily change in its composition even at the vaporization temperature, and can minimize the formation of by-products such as thermal decomposition materials, in an economical and efficient manner.

Still another object of the present invention is to provide a method for forming a ruthenium-containing film, wherein the ruthenium-containing film is formed using the ruthenium precursor composition in a stable and efficient manner.

Still another object of the present invention is to provide a ruthenium-containing film having a uniform thickness and excellent quality even on various substrates formed using the ruthenium precursor composition.

However, the problems to be solved by the present invention are not limited to those mentioned above, and other problems not mentioned will be clearly understood by those skilled in the art from the following description.

Solution to Problem

The present invention provides a ruthenium precursor composition, which comprises 20% to 60% by weight of a compound represented by the following Formula 1, 20% to 50% by weight of a compound represented by the following Formula 2, and 0% to 55% by weight of a compound represented by the following Formula 3, based on the total weight of the ruthenium precursor composition:

[Formula 1]

The present invention provides a method for preparing a ruthenium precursor composition, which comprises subjecting a compound represented by the following Formula 4 to a reaction with an alkali metal carbonate salt represented by the following Formula 5 and 1,5-hexadiene in an organic solvent, wherein the ruthenium precursor composition comprises 20% to 60% by weight of a compound represented by the following Formula 1, 20% to 50% by weight of a compound represented by the following Formula 2, and 0% to 55% by weight of a compound represented by the following Formula 3, based on the total weight of the ruthenium precursor composition:

In the above formulae,
M is selected from the group consisting of Li, Na, and K, and
X is selected from the group consisting of Cl, Br, and I.

In addition, the present invention provides a method for forming a ruthenium-containing film, which comprises preparing a ruthenium precursor composition; and forming a ruthenium-containing film using the ruthenium precursor composition, wherein the ruthenium precursor composition is prepared by subjecting a compound represented by the above Formula 4 to a reaction with an alkali metal carbonate salt represented by the above Formula 5 and 1,5-hexadiene in an organic solvent and comprises 20% to 60% by weight of a compound represented by the above Formula 1, 20% to 50% by weight of a compound represented by the above Formula 2, and 0% to 55% by weight of a compound represented by the above Formula 3, based on the total weight of the ruthenium precursor composition.

In addition, the present invention provides a ruthenium-containing film formed using the ruthenium precursor composition.

Advantageous Effects of Invention

According to an embodiment of the present invention, a very thermally stable ruthenium precursor composition can be provided in an economical and efficient manner by controlling the contents of the compound represented by Formula 1, the compound represented by Formula 2, and the compound represented by Formula 3 within a specific range, respectively.

When a ruthenium-containing film is formed using the ruthenium precursor composition according to an embodiment of the present invention, it is possible to prevent the ruthenium precursor composition from changing in its composition during the vaporization thereof, or thereafter, and to minimize the formation of by-products such as thermal decomposition materials. As a result, it is possible to obtain a deposition result having stable and consistent physical properties in a semiconductor process, thereby providing a ruthenium-containing film with guaranteed reproducibility and reliability.

Further, according to another embodiment of the present invention, it is possible to uniformly form a ruthenium-containing film in a thickness of several nanometers to several micrometers in various temperature ranges even on a substrate having patterns (grooves) on its surface, a porous substrate, or a plastic substrate, whereby it is possible to achieve a ruthenium-containing film of high quality.

BEST MODE FOR CARRYING OUT THE INVENTION

Hereinafter, the present invention will be described in detail.

The advantages and features of the present invention and the methods of achieving them will become apparent with reference to the embodiments described hereinafter. However, the present invention is not limited to the embodiments described below, but may be embodied in various different forms. These embodiments are provided so that the disclosure of the present invention will be thorough and complete, and will fully convey the scope of the invention to those skilled in the art. The invention is defined by only the scope of the claims.

In addition, in the present specification, in the case where an element is mentioned to be formed "on" another element, it means not only that one element is directly formed "on" another element, but also that other element(s) is interposed between them.

In the present specification, when a part is referred to as "comprising" an element, it is to be understood that the part may comprise other elements as well, rather than exclude other elements, unless otherwise indicated.

All numbers and expressions related to the quantities of components, reaction conditions, and the like used herein are to be understood as being modified by the term "about," unless otherwise indicated.

[Ruthenium Precursor Composition]

The ruthenium precursor composition according to an embodiment of the present invention comprises 20% to 60% by weight of a compound represented by the following Formula 1, 20% to 50% by weight of a compound represented by the following Formula 2, and 0% to 55% by weight of a compound represented by the following Formula 3, based on the total weight of the ruthenium precursor composition:

[Formula 1]

[Formula 2]

[Formula 3]

As the contents of the compound represented by Formula 1, the compound represented by Formula 2, and the compound represented by Formula 3 are each controlled to specific ranges, the thermal stability of the ruthenium precursor composition can be greatly enhanced.

When a ruthenium-containing film is formed using the ruthenium precursor composition of the present invention having excellent thermal stability, it is possible to minimize the change of the ruthenium precursor composition in its composition at a high temperature of 100° C. or higher, during the vaporization thereof, and over time thereafter and the formation of by-products such as thermal decomposition materials.

Thus, the present invention has a great technical significance in that, as it provides a ruthenium precursor composition having the above characteristics, it is possible to obtain a deposition result having more stable and consistent physical properties in a semiconductor process, thereby providing a ruthenium-containing film with guaranteed reproducibility and reliability.

According to an embodiment of the present invention, it is very important to control the content range and content ratio of each compound to achieve the above characteristics.

The ruthenium precursor composition may comprise the compound represented by Formula 1 in an amount of, for example, 22% by weight to 60% by weight, for example, 25% by weight to 60% by weight, for example, 28% by weight to 60% by weight, for example, 30% by weight to 60% by weight, for example, 35% by weight to 60% by weight, for example, 40% by weight to 60% by weight, for example, 45% by weight to 60% by weight, for example, 50% by weight to 60% by weight, or, for example, 55% by weight to 60% by weight, based on the total weight of the ruthenium precursor composition. If the compound represented by Formula 1 satisfies the above content range, thermal stability can be further enhanced, and the formation of by-products such as thermal decomposition materials can be minimized.

In addition, the ruthenium precursor composition may comprise the compound represented by Formula 2 in an amount of, for example, 22% by weight to 50% by weight, for example, 25% by weight to 50% by weight, for example, 28% by weight to 50% by weight, for example, 30% by weight to 50% by weight, or, for example, 35% by weight to 50% by weight, based on the total weight of the ruthenium precursor composition. If the compound represented by Formula 2 satisfies the above content range, thermal stability can be further enhanced, and the formation of by-products such as thermal decomposition materials can be minimized.

In addition, the ruthenium precursor composition may comprise the compound represented by Formula 3 in an amount of, for example, 0% by weight to 25% by weight, for example, 0% by weight to 20% by weight, for example, 0% by weight to 18% by weight, for example, 0% by weight to 15% by weight, for example, 0% by weight to 10% by weight, for example, 0% by weight to 8% by weight, for example, 0% by weight to 7% by weight, for example, 0% by weight to 6% by weight, for example, 0% by weight to 5% by weight, for example, 0% by weight to 4% by weight, for example, 0% by weight to 3% by weight, for example, 0% by weight to 2% by weight, or, for example, 0% by weight to 1% by weight, based on the total weight of the ruthenium precursor composition.

The ruthenium precursor composition may comprise the compound represented by Formula 3 in an amount of 10% by weight or less, 9% by weight or less, 8% by weight or less, 5% by weight or less, 3% by weight or less, 2% by weight or less, or 1% by weight or less, based on the total weight of the ruthenium precursor composition.

If the compound represented by Formula 3 satisfies the above content range, the ruthenium precursor composition is very thermally stable, and the formation of by-products such as thermal decomposition materials can be minimized at a temperature of 100° C. or higher.

The compound represented by Formula 1, the compound represented by Formula 2, and the compound represented by Formula 3 may be isomers having the same molecular weight.

Each content of the compound represented by Formula 1, the compound represented by Formula 2, and the compound represented by Formula 3 is, for example, a value calculated by obtaining the integral ratio of an NMR peak relative to the total sum of integral values of the NMR peaks, which is 100%, when measured by 1H-NMR (400 MHz, $C_6D_6$, 25° C.). Since the ruthenium precursor composition comprises a mixture of the compound represented by Formula 1, the compound represented by Formula 2, and the compound represented by Formula 3 as a mixture of three isomers having the same molecular weight, each content thereof can be expressed as % by weight.

In particular, according to an embodiment of the present invention, it is very important to control the content of the compound represented by Formula 3.

That is, when the compound represented by Formula 3 satisfies the specific content range or less, thermal stability is excellent, so that the change in composition is small during the vaporization process, and thermal decomposition is minimized, thereby preventing the formation of by-products. However, if the compound represented by Formula 3 does not satisfy the specific content range and is employed too much, the composition easily changes during the vaporization process, so that the composition easily changes at a certain temperature or higher over time, and the formation of by-products increases, which makes it difficult to obtain a deposition result having stable and consistent characteristics, resulting in difficulties in achieving reproducibility and reliability.

In addition, the ruthenium precursor composition may not comprise the compound represented by Formula 3.

In such a case, it may be more advantageous in achieving the object since the ruthenium precursor composition is very thermally stable.

The ratio of the total content of the compound represented by Formula 1 and the compound represented by Formula 2 to the content of the compound represented by Formula 3, based on weight, is, for example, 100:0 to 80:20, for example, 100:0 to 85:15, for example, 100:0 to 90:10, for example, 100:0 to 95:5, or, for example, 100:0 to 97:3.

If the ratio of the total content of the compound represented by Formula 1 and the compound represented by Formula 2 to the content of the compound represented by Formula 3 satisfies the above range, it may be more advantageous in achieving the object since the ruthenium precursor composition is very thermally stable.

In addition, the weight ratio of the compound represented by Formula 1 to the compound represented by Formula 2 is, for example, 7:3 to 5:5, for example, 7:3 to 5.5:4.5, for example, 6.5:3.5 to 5.5:4.5, for example, 6:4 to 5:5, or, for example, 5.5:4.5 to 5:5. If the weight ratio of the compound represented by Formula 1 to the compound represented by Formula 2 satisfies the above range, it may be more advantageous in achieving the object since the ruthenium precursor composition is very thermally stable.

According to another embodiment of the present invention, the ruthenium precursor composition may comprise more of the compound represented by Formula 1 than the compound represented by Formula 2. In such a case, it may be more advantageous for further enhancing thermal stability and minimizing the formation of by-products due to thermal decomposition.

According to another embodiment of the present invention, the weight ratio of the compound represented by Formula 1, the compound represented by Formula 2, and the compound represented by Formula 3 may be, for example, 20 to 60:20 to 50:0 to 50, for example, 30 to 60:25 to 50:0 to 30, for example, 35 to 60:30 to 50:0 to 20, or, for example, 40 to 60:30 to 50:0 to 10. If the ratio of the compound represented by Formula 1, the compound represented by Formula 2, and the compound represented by Formula 3 satisfies the above range, it may be more advantageous in achieving the object of the present invention since the ruthenium precursor composition is very thermally stable.

Meanwhile, the ruthenium precursor composition may comprise by-products. The by-products may comprise unreacted materials formed during the process for preparing the ruthenium precursor composition, impurities formed by thermal decomposition, and the like.

The content of the by-products in the ruthenium precursor composition may be 30% by weight or less, 25% by weight or less, 20% by weight or less, 15% by weight or less, 10% by weight or less, 9% by weight or less, 8% by weight or less, 7% by weight or less, 6% by weight or less, 5% by weight or less, 4% by weight or less, 3% by weight or less, 2% by weight or less, 1% by weight or less, 0.5% by weight or less, 0.2% by weight or less, or 0% by weight, based on the total weight of the ruthenium precursor composition.

Specifically, the ruthenium precursor composition may comprise one or more by-products. For example, the by-product may comprise a first by-product or a second by-product having different components, or a combination thereof.

In addition, according to an embodiment of the present invention, by-products may not be contained.

Specifically, when the ruthenium precursor composition is placed in a sealed stainless-steel canister, heated, cooled to room temperature, and measured by $^1$H-NMR (400 MHz, $C_6D_6$, 25° C.), and the total sum of integral values of NMR peaks at about 2.01 ppm (Formula 1), about 1.97 ppm (Formula 2), about 1.95 ppm (by-product A), about 1.86 ppm (by-product B), about 1.84 ppm (Formula 3) is 100%, the sum of integral values of two integral peaks at 1.95 ppm (by-product A) and 1.86 ppm (by-product A) that do not appear in an NMR spectrum before heating is 30% or less, or NMR peaks do not appear at 1.95 ppm, 1.86 ppm, or both. Preferably, no NMR peaks are measured at 1.95 ppm, 1.86 ppm, or both, more specifically, at 1.95 ppm and 1.86 ppm.

The materials with NMR peaks at 1.95 ppm and 1.86 ppm are impurities formed by thermal decomposition by heating for a long period of time. Since the thermal stability of the ruthenium precursor composition according to the present invention is greatly enhanced, the above NMR peaks are preferably not observed.

The NMR spectrum is for the analysis of thermal stability. For example, a ruthenium precursor composition vaporized by heating to about 120° C. in a vacuum state and flowing an argon carrier gas at a flow rate of about 200 sccm is recovered by cooling to about −76° C. The composition recovered by vaporization for the first 7 days (week 1) and the composition recovered by vaporization from day 8 to day 14 (week 2) may be measured by $^1$H-NMR (400 MHz, $C_6D_6$, 25° C.), respectively.

Thus, since the ruthenium precursor composition according to the present invention can achieve a stable and consistent deposition result in a semiconductor process, it can be advantageous in terms of reliability and reproducibility.

[Method for Preparing a Ruthenium Precursor Composition]

The method for preparing a ruthenium precursor composition according to an embodiment of the present invention comprises subjecting a compound represented by the following Formula 4 to a reaction with an alkali metal carbonate salt represented by the following Formula 5 and 1,5-hexadiene in an organic solvent, wherein the ruthenium precursor composition comprises 20% to 60% by weight of a compound represented by the following Formula 1, 20% to 50% by weight of a compound represented by the following Formula 2, and 0% to 55% by weight of a compound represented by the following Formula 3, based on the total weight of the ruthenium precursor composition:

[Formula 1]

[Formula 2]

[Formula 3]

[Formula 4]

[Formula 5]
$M_2CO_3$

In the above formulae,

M is selected from the group consisting of Li, Na, and K, and

X is selected from the group consisting of Cl, Br, and I.

According to an embodiment of the present invention, as the method comprises subjecting a compound represented by the above Formula 4 to a reaction with an alkali metal carbonate salt represented by the above Formula 5 and 1,5-hexadiene in an organic solvent, a thermally stable ruthenium precursor composition as desired can be prepared in an economical and efficient manner.

Specifically, as shown in the following Reaction Scheme 1, the method for preparing a ruthenium precursor composition according to an embodiment of the present invention may comprise subjecting a compound represented by the above Formula 4 to a reaction with an alkali metal carbonate salt represented by the above Formula 5 and 1,5-hexadiene in an organic solvent:

[Reaction Scheme 1]

In Reaction Scheme 1,
X is as defined above.

In the method for preparing a ruthenium precursor composition according to an embodiment of the present invention, the reaction may be a reflux reaction, but it may not be limited thereto.

Specifically, the reaction may comprise a reflux reaction carried out at, for example, 60 to 160° C., for example, 70 to 150° C., or, for example, 80 to 140° C., for about 10 hours to 100 hours, about 20 hours to 100 hours, or about 20 hours to 80 hours.

In an embodiment of the present invention, the organic solvent may comprise a primary alcohol or a secondary alcohol having 5 carbon atoms or less, but it may not be limited thereto.

The primary alcohol or secondary alcohol having 5 carbon atoms or less may act as a solvent and as a reducing agent at the same time. Thus, the ruthenium compound according to the present invention can be produced by an economical and simple process that does not require a separate reducing agent.

The primary alcohol or secondary alcohol may be selected from the group consisting of methanol, ethanol, n-propyl alcohol, iso-propyl alcohol, n-butanol, iso-butanol, n-pentanol, iso-pentanol, and combinations thereof, but it may not be limited thereto.

The alkali metal carbonate salt may comprise at least one selected from the group consisting of $Na_2CO_3$, $Li_2CO_3$, and $K_2CO_3$.

In addition, in the method for preparing a ruthenium precursor composition, 1,5-hexadiene may be used as a material that is reacted with the compound represented by Formula 4 and the alkali metal carbonate salt represented by Formula 5. 1,5-Hexadiene can be very advantageous for commercial applications since it is cost-effective and can be purchased in large quantities as compared with, for example, 2,4-hexadiene or 1,3-hexadiene.

Specifically, it is not easy to commercially purchase 2,4-hexadiene or 1,3-hexadiene, and their purchase and purchase amount are very limited (for example, limited to several grams or several tens of grams). Thus, there may be limitations in the mass production of a desired ruthenium precursor composition using 2,4-hexadiene or 1,3-hexadiene. In contrast, it is easy to purchase 1,5-hexadiene in large quantities at a low price. Further, when it is used in the preparation of the ruthenium precursor composition, in particular, even when it is used in the preparation of the ruthenium precursor composition that does not comprise the compound represented by Formula 3, desired effects can be readily and efficiently produced. That is, the use of 1,5-hexadiene may be very advantageous in terms of cost, productivity, efficiency, and quality in the preparation process of the ruthenium precursor composition and a semiconductor process.

Meanwhile, in the method for preparing a ruthenium precursor composition according to an embodiment of the present invention, the molar ratio of the compound represented by Formula 4, the alkali metal carbonate salt, and 1,5-hexadiene may be, for example, 1:2 to 10:1 to 8, for example, 1:2 to 10:2 to 8, or, for example, 1:4 to 10:3 to 7.

If the molar ratio of the compound represented by Formula 4, the alkali metal carbonate salt, and 1,5-hexadiene satisfies the above range, it may be more advantageous for achieving the effect desired in the present invention.

Meanwhile, in an embodiment of the present invention, the compound of Formula 4 may be prepared as shown in the following Reaction Scheme 2.

[Reaction Scheme 2]

In Reaction Scheme 2,
X is as defined above, and
n is 0 or an integer of 10 or less.

Specifically, the compound represented by Formula 4, [$RuX_2$(p-cymene)]2, may be prepared by a reaction of α-terpinene represented by Formula 6 or γ-terpinene represented by Formula 7 with ruthenium trichloride hydrate ($RuX_3 \cdot nH_2O$) in an organic solvent such as alcohol.

In such an event, β-terpinene, δ-terpinene, α-phellandrene, β-phellandrene, or isomers thereof may be used instead of α-terpinene or γ-terpinene. In an embodiment of the present invention, a reaction for preparing the compound represented by Formula 4 may be a reflux reaction, but it is not limited thereto.

In the method for preparing a ruthenium precursor composition according to an embodiment of the present invention, the reflux reaction may be carried out once or at least twice.

Specifically, it may comprise subjecting a compound represented by Formula 4 to a first reflux reaction with an alkali metal carbonate salt represented by Formula 5 and 1,5-hexadiene in an organic solvent.

In addition, after a compound represented by Formula 4 is subjected to a reaction, for example, a first reflux reaction, with an alkali metal carbonate salt represented by Formula 5 and 1,5-hexadiene in an organic solvent, the method for preparing a ruthenium precursor composition may further comprise carrying out distillation at a reduced pressure of 0.1 Torr to 1 Torr, 0.1 Torr to 0.7 Torr, 0.1 Torr to 0.5 Torr, or 0.2 Torr to 0.4 Torr, and 50° C. to 200° C., 70° C. to 150° C., 70° C. to 140° C., or 80° C. to 120° C.

In addition, the composition of the ruthenium precursor composition may be adjusted by changing the distillation conditions. Specifically, the compound represented by Formula 3 can be adjusted to be contained in an amount of, for example, about 10% by weight or less by changing the distillation conditions to 100° C. to 120° C. at 0.2 Torr to 0.4 Torr.

Meanwhile, in the method for preparing a ruthenium precursor composition according to another embodiment of the present invention, the reflux reaction may be carried out at least twice, for example, twice.

Specifically, as shown in the following Reaction Scheme 3, the reaction may comprise a first reflux reaction of a compound represented by Formula 4 with a first alkali metal carbonate salt and 1,5-hexadiene in the organic solvent; and a second reflux reaction of the resultant obtained by the first reflux reaction with a second alkali metal carbonate salt.

[Reaction Scheme 3]

Formula 4

Formula 1     Formula 2

In Reaction Scheme 3,

X is as defined above.

In Reaction Scheme 3, the first reflux reaction may be carried out at 60 to 160° C., for example, 70 to 140° C., or, for example, 90 to 120° C., for about 10 hours to 40 hours, about 15 hours to 35 hours, or about 20 hours to 25 hours.

In Reaction Scheme 3, the second reflux reaction may be carried out at 60 to 160° C., for example, 70 to 140° C., or, for example, 90 to 120° C., for about 10 hours to 60 hours, about 15 hours to 55 hours, or about 20 hours to 50 hours.

The first alkali metal carbonate salt may comprise $Li_2CO_3$. If $Li_2CO_3$ is used as the first alkali metal carbonate salt, it can be confirmed that the NMR peak corresponding to 1,5-hexadiene decreases and then completely disappears when analyzed by NMR during the first reflux reaction. An isomerization reaction is known in which hydrogen bonded to a double-bonded carbon coordinated to the Ru central metal is transferred to another carbon [Y. M. Wuu et al., Inorganic Chemistry 1988, 27(17), 3039-3044, doi: 10.1021/ic00290a028]. It is assumed that 1,5-hexadiene used as a raw material is changed to 2,4-hexadiene and 1,3-hexadiene through such an isomerization reaction. For this reason, it may be more advantageous for controlling the ruthenium precursor composition within a specific range as desired in the present invention.

In addition, the second alkali metal carbonate salt may comprise $Na_2CO_3$, $K_2CO_3$, or a combination thereof, preferably, $Na_2CO_3$. If $Na_2CO_3$ is used as the second alkali metal carbonate salt, a high yield can be achieved; thus, it is more advantageous for controlling the ruthenium precursor composition within a specific range as desired in the present invention.

The molar ratio of the first alkali metal carbonate salt and the second alkali metal carbonate salt may be, for example, 1:0.2 to 3.0, for example, 1:0.5 to 2.5, for example, 1:0.5 to 2.0, or, for example, 1:0.5 to 2.0. If the molar ratio of the first alkali metal carbonate salt and the second alkali metal carbonate salt satisfies the above range, it is more advanta- geous for obtaining a ruthenium precursor composition desired in the present invention.

Meanwhile, the method for preparing a ruthenium precursor composition according to an embodiment of the present invention may further comprise cooling the resultant to room temperature before performing the second reflux reaction.

Specifically, it may comprise a first reflux reaction of a compound represented by Formula 4 with a first alkali metal carbonate salt and 1,5-hexadiene in the organic solvent; cooling the resultant obtained by the first reflux reaction to room temperature; and a second reflux reaction of the resultant with a second alkali metal carbonate salt.

In addition, according to an embodiment of the present invention, the method for preparing a ruthenium precursor composition may further comprise distillation and/or filtration after the second reflux reaction.

The distillation and/or filtration is as described above.

According to an embodiment of the present invention, as the method for preparing a ruthenium precursor composition is used, the compound represented by Formula 1, the compound represented by Formula 2, and the compound represented by Formula 3 can each be adjusted to have the specific content range. In particular, the content of the compound represented by Formula 3 can be adjusted to 10% by weight or less.

In addition, according to an embodiment of the present invention, as the method for preparing a ruthenium precursor composition is used, it is possible to control such that the compound represented by Formula 3 is not contained.

In such a case, it is possible to provide a very thermally stable ruthenium precursor composition. When a ruthenium-containing film is formed using the same, it is possible to prevent the ruthenium precursor composition from changing in its composition during the vaporization thereof, or thereafter, and to minimize the formation of by-products such as thermal decomposition materials. As a result, it is possible to obtain a deposition result having stable and consistent physical properties in a semiconductor process, thereby providing a ruthenium-containing film with guaranteed reproducibility and reliability.

[Method for Forming a Ruthenium-Containing Film]

According to an embodiment of the present invention, a ruthenium-containing film may be formed using the ruthenium precursor composition prepared by the above method.

Specifically, the method for forming a ruthenium-containing film comprises preparing a ruthenium precursor composition (first step); and forming a ruthenium-containing film using the ruthenium precursor composition (second step), wherein the ruthenium precursor composition is prepared by subjecting a compound represented by Formula 4 to a reaction with an alkali metal carbonate salt represented by Formula 5 and 1,5-hexadiene in an organic solvent and comprises 20% to 60% by weight of a compound represented by the following Formula 1, 20% to 50% by weight of a compound represented by the following Formula 2, and 0% to 55% by weight of a compound represented by the following Formula 3, based on the total weight of the ruthenium precursor composition.

In the method for forming a ruthenium-containing film, the step of preparing a ruthenium precursor composition (first step) is as described above.

The method for forming a ruthenium-containing film may comprise forming a ruthenium-containing film using the ruthenium precursor composition (second step).

Specifically, the second step is a step of depositing a ruthenium-containing film on a substrate using the ruthenium precursor composition. It may comprise forming a ruthenium-containing film on a substrate by supplying the ruthenium precursor composition in a gaseous state.

In an embodiment of the present invention, the ruthenium-containing film may be formed on one or more substrates selected from conventional semiconductor wafers, compound semiconductor wafers, and plastic substrates (PI, PET, PES, and PEN), but it may not be limited thereto. In addition, a substrate having holes or grooves may be used, and a porous substrate having a large surface area may be used, but it may not be limited thereto. In addition, the ruthenium-containing film may be formed simultaneously or sequentially on all or part of a substrate in which two or more different types of substrates are in contact with, or connected, to each other, but it may not be limited thereto.

According to an embodiment of the present invention, in the method for depositing a ruthenium-containing film, a substrate is accommodated in a reaction chamber, and the ruthenium precursor composition is then transferred onto the substrate using a carrier gas or a diluent gas to deposit the ruthenium-containing film.

Specifically, the deposition may be formed in a temperature range of room temperature to 550° C., room temperature to about 500° C., room temperature to about 450° C., room temperature to about 400° C., room temperature to about 350° C., room temperature to about 300° C., room temperature to about 250° C., room temperature to about 200° C., room temperature to about 150° C., room temperature to about 100° C., about 100° C. to about 550° C., about 100° C. to about 500° C., about 100° C. to about 450° C., about 100° C. to about 400° C., about 100° C. to about 350° C., about 100° C. to about 300° C., about 100° C. to about 250° C., about 100° C. to about 200° C., about 100° C. to about 150° C., about 150° C. to about 550° C., about 150° C. to about 500° C., about 150° C. to about 450° C., about 150° C. to about 400° C., about 150° C. to about 350° C., about 150° C. to about 300° C., about 150° C. to about 250° C., about 150° C. to about 200° C., about 200° C. to about 400° C., about 200° C. to about 350° C., about 200° C. to about 300° C., about 200° C. to about 250° C., about 250° C. to about 400° C., about 250° C. to about 350° C., about 250° C. to about 300° C., about 300° C. to about 400° C., about 300° C. to about 550° C., about 300° C. to about 500° C., about 300° C. to about 350° C., or about 350° C. to about 400° C., but it may not be limited thereto. In an embodiment of the present invention, the ruthenium-containing film may be formed in a temperature range of about 200° C. to about 500° C. or about 300° C. to about 500° C.

In an embodiment of the present invention, the ruthenium-containing film may be deposited by chemical vapor deposition (CVD), specifically, metalorganic chemical vapor deposition (MOCVD), or atomic layer deposition (ALD), but it may not be limited thereto. In an embodiment of the present invention, the chemical vapor deposition or atomic layer deposition of the ruthenium-containing film may be carried out using a deposition apparatus, deposition conditions, and one or more additional reactive gases known in the art, but it may not be limited thereto.

In an embodiment of the present invention, hydrogen ($H_2$) gas, ammonia ($NH_3$) gas, oxygen ($O_2$) gas, or ozone ($O_3$) gas used in semiconductor processes may be used as the reaction gas for the ALD and CVD methods to form a ruthenium-containing film, but it may not be limited thereto.

For example, if hydrogen gas and/or ammonia gas is used to form a film in the ALD and CVD methods, a ruthenium-containing film containing less impurities can be formed. For example, if oxygen gas or ozone gas is used to form a film in the ALD and CVD methods, a ruthenium metal film or a ruthenium oxide film may be formed, but it may not be limited thereto.

In an embodiment of the present invention, the method for forming a ruthenium-containing film comprises supplying a ruthenium precursor composition in a gaseous state onto a substrate located in a deposition chamber to form a ruthenium-containing film on the surface of the substrate, but it may not be limited thereto.

In an embodiment of the present invention, the ruthenium-containing film may be formed in a thickness range of about 1 nm to about 500 nm, while it may be applied in various ways according to the application purpose, but it may not be limited thereto. For example, the ruthenium-containing film may be formed in a thickness range of about 1 nm to about 500 nm, about 1 nm to about 400 nm, about 1 nm to about 300 nm, about 1 nm to about 200 nm, about 1 nm to about 100 nm, about 1 nm to about 50 nm, about 1 nm to about 40 nm, about 1 nm to about 30 nm, about 1 nm to about 20 nm, about 1 nm to about 10 nm, about 10 nm to about 500 nm, about 10 nm to about 400 nm, about 10 nm to about 300 nm, about 10 nm to about 200 nm, about 10 nm to about 100 nm, about 10 nm to about 50 nm, about 10 nm to about 40 nm, about 10 nm to about 30 nm, about 10 nm to about 20 nm, about 20 nm to about 500 nm, about 20 nm to about 400 nm, about 20 nm to about 300 nm, about 20 nm to about 200 nm, about 20 nm to about 100 nm, about 20 nm to about 50 nm, about 20 nm to about 40 nm, about 20 nm to about 30 nm, about 30 nm to about 500 nm, about 30 nm to about 400 nm, about 30 nm to about 300 nm, about 30 nm to about 200 nm, about 30 nm to about 100 nm, about 30 nm to about 50 nm, about 30 nm to about 40 nm, about 40 nm to about 500 nm, about 40 nm to about 400 nm, about 40 nm to about 300 nm, about 40 nm to about 200 nm, about 40 nm to about 100 nm, about 40 nm to about 50 nm, about 50 nm to about 500 nm, about 50 nm to about 400 nm, about 50 nm to about 300 nm, about 50 nm to about 200 nm, about 50 nm to about 100 nm, about 100 nm to about 500 nm, about 100 nm to about 400 nm, about 100 nm to about 300 nm, about 100 nm to about 200 nm, about 200 m to about 500 nm, about 200 nm to about 400 nm, about 200 nm to about 300 nm, about 300 nm to about 500 nm, about 300 nm to about 400 nm, or about 400 nm to about 500 nm, it may not be limited thereto. In an embodiment of the present invention, the ruthenium-containing film may be formed in a thickness range of about 1 nm to about 50 nm.

In an embodiment of the present invention, the ruthenium-containing film may be formed on a substrate comprising unevenness (grooves) having an aspect ratio of about 1 to about 100 and a width of about 10 nm to about 1 μm, but it may not be limited thereto. The unevenness (grooves) may be in the form of holes or trenches. For example, the aspect ratio may be about 1 or more, about 10 or more, about 30 or more, about 50 or more, about 1 to about 100, about 1 to about 90, about 1 to about 80, about 1 to about 70, about 1 to about 60, about 1 to about 50, about 1 to about 40, about 1 to about 30, about 1 to about 20, about 1 to about 10, 10 to about 100, about 10 to about 90, about 10 to about 80, about 10 to about 70, about 10 to about 60, about 10 to about 50, about 10 to about 40, about 10 to about 30, about 10 to about 20, about 20 to about 100, about 20 to about 90, 20 to about 80, about 20 to about 70, about 20 to about 60, about 20 to about 50, about 20 to about 40, about 20 to about 30, about 30 to about 100, about 30 to about 90, about 30 to about 80, about 30 to about 70, about 30 to about 60, about 30 to about 50, about 30 to about 40, about 40 to about 100, about 40 to about 90, about 40 to about 80, about 40 to about 70, about 40 to about 60, about 40 to about 50, about 50 to about 100, about 50 to about 90, about 50 to about 80, about 50 to about 70, about 50 to about 60, about 60 to about 100, about 60 to about 90, about 60 to about 80, about 60 to about 70, about 70 to about 100, about 70 to about 90, about 70 to about 80, about 80 to about 100, about 80 to about 90, or about 90 to about 100, but it may not be limited thereto. In addition, for example, the width may be about 10 nm to about 1 μm, about 10 nm to about 900 nm, about 10 nm to about 800 nm, about 10 nm to about 700 nm, about 10 nm to about 600 nm, about 10 nm to about 500 nm, about 10 nm to about 400 nm, about 10 nm to about 300 nm, about 10 nm to about 200 nm, about 10 nm to about 100 nm, about 10 nm to about 90 nm, about 10 nm to about 80 nm, about 10 nm to about 70 nm, about 10 nm to about 60 nm, about 10 to about 50 nm, about 10 nm to about 40 nm, about 10 nm to about 30 nm, about 10 nm to about 20 nm, about 20 nm to about 1 μm, about 20 nm to about 900 nm, about 20 nm to about 800 nm, about 20 nm to about 700 nm, about 20 nm to about 600 nm, about 20 nm to about 500 nm, about 20 nm to about 400 nm, about 20 nm to about 300 nm, about 20 nm to about 200 nm, about 20 nm to about 100 nm, about 20 nm to about 90 nm, about 20 nm to about 80 nm, about 20 nm to about 70 nm, about 20 nm to about 60 nm, about 20 nm to about 50 nm, about 20 nm to about 40 nm, about 20 nm to about 30 nm, about 30 nm to about 1 μm, about 30 nm to about 900 nm, about 30 nm to about 800 nm, about 30 nm to about 700 nm, about 30 nm to about 600 nm, about 30 nm to about 500 nm, about 30 nm to about 400 nm, about 30 nm to about 300 nm, about 30 nm to about 200 nm, about 30 nm to about 100 nm, about 30 nm to about 90 nm, about 30 nm to about 80 nm, about 30 nm to about 70 nm, about 30 nm to about 60 nm, about 30 to about 50 nm, about 30 nm to about 40 nm, about 40 nm to about 1 μm, about 40 nm to about 900 nm, about 40 nm to about 800 nm, about 40 nm to about 700 nm, about 40 nm to about 600 nm, about 40 nm to about 500 nm, about 40 nm to about 400 nm, about 40 nm to about 300 nm, about 40 nm to about 200 nm, about 40 nm to about 100 nm, about 40 nm to about 90 nm, about 40 nm to about 80 nm, about 40 nm to about 70 nm, about 40 nm to about 60 nm, about 40 to about 50 nm, about 50 nm to about 1 μm, about 50 nm to about 900 nm, about 50 nm to about 800 nm, about 50 nm to about 700 nm, about 50 nm to about 600 nm, about 50 nm to about 500 nm, about 50 nm to about 400 nm, about 50 nm to about 300 nm, about 50 nm to about 200 nm, about 50 nm to about 100 nm, about 50 nm to about 90 nm, about 50 nm to about 80 nm, about 50 nm to about 70 nm, about 50 nm to about 60 nm, about 100 nm to about 1 μm, about 100 nm to about 900 nm, about 100 nm to about 800 nm, about 100 nm to about 700 nm, about 100 nm to about 600 nm, about 100 nm to about 500 nm, about 100 nm to about 400 nm, about 100 nm to about 300 nm, about 100 nm to about 200 nm, about 200 nm to about 1 μm, about 200 nm to about 900 nm, about 200 nm to about 800 nm, about 200 nm to about 700 nm, about 200 nm to about 600 nm, about 200 nm to about 500 nm, about 200 nm to about 400 nm, about 200 nm to about 300 nm, about 300 nm to about 1 μm, about 300 nm to about 900 nm, about 300 nm to about 800 nm, about 300 nm to about 700 nm, about 300 nm to about 600 nm, about 300 nm to about 500 nm, about 300 nm to about 400 nm, about 400 nm to about 1 μm, about 400 nm to about 900 nm, about 400 nm to about 800 nm, about 400 nm to about 700 nm, about 400 nm to about 600 nm, about 400 nm to about 500 nm, about 500 nm to about 1 μm, about 500 nm to about 900 nm, about 500 nm to about 800 nm, about 500 nm to about 700 nm, about 500 nm to about 600 nm, about 600 nm to about 1 μm, about 600 nm to about 900 nm, about 600 nm to about 800 nm, about 600 nm to about 700 nm, about 700 nm to about 1 μm, about 700 nm to about 900 nm, about 700 nm to about 800 nm, about 800 nm to about 1 μm, about 800 nm to about 900 nm, or about 900 nm to about 1 μm, but it may not be limited thereto.

In an embodiment of the present invention, the ruthenium precursor composition of the present invention contained in the ruthenium-containing film can be used as a precursor for atomic layer deposition or chemical vapor deposition to form a ruthenium-containing film by virtue of its low density and high thermal stability. In particular, it is possible to uniformly form a ruthenium-containing film having a thickness of several micrometers to several nanometers even on a substrate having patterns (grooves) on its surface, a porous substrate, or a plastic substrate in a temperature range of room temperature to 550° C.

In an embodiment of the present invention, in the method for forming a ruthenium-containing film, it is preferable that a substrate is accommodated in a reaction chamber, the ruthenium precursor composition is delivered onto the substrate using a carrier gas or a diluent gas, and a ruthenium-containing metal thin film, oxide thin film, or nitride thin film is deposited at a wide range of deposition temperatures from room temperature to about 550° C., but it may not be limited thereto.

In an embodiment of the present invention, at least one mixed gas selected from argon (Ar), nitrogen ($N_2$), helium (He), or hydrogen ($H_2$) may be preferably used as the carrier gas or a diluent gas, but it may not be limited thereto.

In an embodiment of the present invention, various methods may be applied as the method of delivering the ruthenium precursor composition onto a substrate, such as a bubbling method in which the precursor is forcibly vaporized using a carrier gas, a liquid delivery system (LDS) method for supplying it in a liquid phase at room temperature to be vaporized through a vaporizer; and a vapor flow control (VFC) method for directly supplying the precursor using its vapor pressure. If the vapor pressure is high, a VFC method may be used. If the vapor pressure is low, a bypass method in which a container is heated for evaporation may be used.

A bubbling method in which the ruthenium precursor composition is contained in a bubbler container or a VFC container and subjected to bubbling by a carrier gas in a temperature range of room temperature to about 100° C. and about 0.1 Torr to about 10 Torr, or using a high vapor pressure, to be delivered to a chamber may be used. Specifically, an LDS method in which the ruthenium precursor composition in a liquid phase at room temperature is supplied and vaporized through a vaporizer may be used, but it may not be limited thereto.

In an embodiment of the present invention, in order to vaporize the ruthenium precursor composition, it may be transported with argon (Ar) or nitrogen ($N_2$) gas, thermal energy or plasma may be used, or a bias may be applied to the substrate.

In an embodiment of the present invention, the deposition temperature of room temperature to about 550° C., or from about 200° C. to about 500° C., makes wide the process temperature applicable to memory devices, logic devices, and display devices; thus, it can be applied to various fields.

In an embodiment of the present invention, when the ruthenium-containing film is deposited as a ruthenium-containing metal film or oxide film, at least one selected from water vapor ($H_2O$), oxygen ($O_2$), oxygen plasma ($O_2$ plasma), nitrogen oxide (NO, $N_2O$), nitrogen oxide plasma (N₂O plasma), oxygen nitride (N₂O₂), hydrogen peroxide (H₂O₂), and ozone (O₃) may be used as a reaction gas.

In an embodiment of the present invention, when the ruthenium-containing film is deposited as a ruthenium-containing nitride film, at least one selected from ammonia (NH₃), ammonia plasma (NH₃ plasma), hydrazine (N₂H₄), and nitrogen plasma (N₂ plasma) may be used as a reaction gas.

When a ruthenium-containing film is formed using the ruthenium precursor composition according to an embodiment of the present invention, it is possible to prevent the ruthenium precursor composition from changing in its composition during the vaporization thereof, or thereafter, and to minimize the formation of by-products such as thermal decomposition materials. As a result, it is possible to obtain a deposition result having stable and consistent physical properties in a semiconductor process, thereby efficiently providing a ruthenium-containing film with guaranteed reproducibility and reliability.

[Ruthenium-Containing Film]

According to an embodiment of the present invention, there is provided a ruthenium-containing film formed using the ruthenium precursor composition.

The ruthenium-containing film may have a thickness of about 1 nanometer (nm) to several micrometers (μm) and may be variously applied depending on the application purposes.

For example, the thickness, aspect ratio, and width of the ruthenium-containing film are as described above and may be variously selected.

As the contents of the compound represented by Formula 1, the compound represented by Formula 2, and the compound represented by Formula 3 are each controlled to specific ranges in the ruthenium precursor composition according to an embodiment of the present invention, it has excellent thermal stability; thus, a ruthenium-containing film can be efficiently formed in a wide temperature range by CVD and ALD. In particular, it is possible to uniformly form a ruthenium-containing film even on a substrate having fine patterns (grooves) on its surface, a porous substrate, or a plastic substrate having a thickness of several micrometers to several tens nanometers in a temperature range of room temperature to 550° C.

The ruthenium-containing film may be at least one selected from the group consisting of a ruthenium-containing metal film, a ruthenium-containing oxide film, a ruthenium-containing carbide film, a ruthenium-containing sulfide film, and a ruthenium-containing nitride film.

MODE FOR THE INVENTION

Mode for the Invention

Hereinafter, the present invention will be described in detail with reference to examples. The following examples are only illustrative of the present invention, and the scope of the present invention is not limited thereto.

EXAMPLES

Preparation Example 1: Preparation of [RuCl₂(p-Cymene)]₂

27 g (0.13 mole) of ruthenium trichloride hydrated (RuCl₃·nH₂O) was dissolved in 200 ml of ethanol (C₂H₅OH) in a flame-dried 500-ml Schlenk flask. 35.4 g (0.26 mole, 2 equivalents) of α-terpinene was slowly added to the solution at room temperature, and the mixture was refluxed for 15 hours to complete the reaction.

Upon completion of the reaction, the dark brown solid obtained by filtration was washed with 50 ml of n-hexane (C₆H₁₄) three times and dried under vacuum to obtain [RuCl₂(p-cymene)]₂ as a reddish brown solid compound.

Example 1: Preparation of a Ruthenium Precursor Composition

[Formula 1]

[Formula 2]

[Formula 3]

30 g (0.048 mole) of [RuCl₂(p-cymene)]₂ obtained in Preparation Example 1 and 31.1 g (0.294 mole) of Na₂CO₃ were mixed with 400 ml of 2-propanol in a flame-dried 1,000-ml Schlenk flask to prepare a suspension. 15.8 g (0.192 mole) of 1,5-hexadiene was slowly added to the suspension, and the mixture was refluxed for 40 hours to complete the reaction. Upon completion of the reaction, the solvent and volatile by-products were removed under a reduced pressure, and the resultant was then extracted using 500 ml of n-hexane. The n-hexane extract was filtered through a Celite pad and a glass frit, and the filtrate thus obtained was subjected to solvent removal under a reduced pressure and distillation under a reduced pressure to obtain a liquid mixture represented by Formula 1, Formula 2, and Formula 3 having the composition shown in Table 1 below. The ratio of the three isomers having the same molecular weight was determined as the relative ratio of integral values of the NMR peaks at 2.01 ppm (Formula 1), 1.97 ppm (Formula 2), and 1.84 ppm (Formula 3) that appeared by the hydrogen of methyl (CH₃) bound to the ligand benzene ring in a ¹H-NMR (400 MHz, C₆D₆, 25° C.) spectrum.

¹H-NMR (400 MHz, C₆D₆, 25° C.):
Compound Represented by Formula 1: (p-cymene)(2,4-hexadiene)Ru,
[CH₃C₆H₄CH(CH₃)₂](CH₃CH=CH—CH=CHCH₃)Ru
δ4.668 (m, 4H, [CH₃C₆H₄CH(CH₃)₂](CH₃CH=CH—CH=CHCH₃)Ru), δ4.330 (m, 2H, [CH$_3$C$_6$H$_4$CH(CH$_3$)$_2$](CH$_3$CH=C<u>H</u>—CH=CHCH$_3$)Ru),
δ2.338 (m, 1H, [CH$_3$C$_6$H$_4$C<u>H</u>(CH$_3$)$_2$](CH$_3$CH=CH—CH=CHCH$_3$)Ru),
δ2.013 (s, 3H, [C<u>H$_3$</u>C$_6$H$_4$CH(CH$_3$)$_2$](CH$_3$CH=CH—CH=CHCH$_3$)Ru),
δ1.371 (d, 6H, [CH$_3$C$_6$H$_4$CH(CH$_3$)$_2$](C<u>H$_3$</u>CH=CH—CH=CHCH$_3$)Ru),
δ1.147 (d, 6H, [CH$_3$C$_6$H$_4$CH(C<u>H$_3$</u>)$_2$](CH$_3$CH=CH—CH=CHCH$_3$)Ru),
δ0.739 (m, 2H, [CH$_3$C$_6$H$_4$CH(CH$_3$)$_2$](CH$_3$C<u>H</u>=CH—CH=C<u>H</u>CH$_3$)Ru), Compound Represented by Formula 2: (p-cymene)(1,3-hexadiene)Ru,
[CH$_3$C$_6$H$_4$CH(CH$_3$)$_2$](CH$_2$=CHCH=CHCH$_2$CH$_3$)Ru
δ4.983 (m, 1H, [CH$_3$C$_6$<u>H</u>$_4$CH(CH$_3$)$_2$](CH$_2$=CHCH=CHCH$_2$CH$_3$)Ru,
δ4.835 (m, 2H, [CH$_3$C$_6$<u>H</u>$_4$CH(CH$_3$)$_2$](CH$_2$=CHCH=CHCH$_2$CH$_3$)Ru,
δ4.727 (m, 1H, [CH$_3$C$_6$<u>H</u>$_4$CH(CH$_3$)$_2$](CH$_2$=CHCH=CHCH$_2$CH$_3$)Ru,
δ4.603 (m, 1H, [CH$_3$C$_6$H$_4$CH(CH$_3$)$_2$](C<u>H</u>CH=CHCH=CHCH$_2$CH$_3$)Ru,
δ4.418 (m, 1H, [CH$_3$C$_6$H$_4$CH(CH$_3$)$_2$](CH$_2$=CHC<u>H</u>=CHCH$_2$CH$_3$)Ru,
δ2.302 (m, 1H, [CH$_3$C$_6$H$_4$C<u>H</u>(CH$_3$)$_2$](CH$_2$=CHCH=CHCH$_2$CH$_3$)Ru,
δ1.969 (s, 3H, [[C<u>H$_3$</u>C$_6$H$_4$CH(CH$_3$)$_2$](CH$_2$=CHCH=CHCH$_2$CH$_3$)Ru,
δ1.758 (d, 1H, [CH$_3$C$_6$H$_4$CH(CH$_3$)$_2$](C<u>H</u>$_2$=CHCH=CHCH$_2$CH$_3$)Ru,
δ1.703 (m, 1H, [CH$_3$C$_6$H$_4$CH(CH$_3$)$_2$](CH$_2$=CHCH=CHCH$_2$CH$_3$)Ru,
δ1.401 (m, 1H, [CH$_3$C$_6$H$_4$CH(CH$_3$)$_2$](CH$_2$=CHCH=CHC<u>H$_2$</u>CH$_3$)Ru,
δ1.120 (t, 3H, [CH$_3$C$_6$H$_4$CH(CH$_3$)$_2$](CH$_2$=CHCH=CHCH$_2$C<u>H$_3$</u>)Ru,
δ1.098 (m, 6H, [CH$_3$C$_6$H$_4$CH(C<u>H$_3$</u>)$_2$](CH$_2$=CHCH=CHCH$_2$CH$_3$)Ru,
δ0.726 (m, 1H, [CH$_3$C$_6$H$_4$CH(CH$_3$)$_2$](CH$_2$=CHCH=C<u>H</u>CH$_2$CH$_3$)Ru,
δ0.194 (d, 1H, [CH$_3$C$_6$H$_4$CH(CH$_3$)$_2$](C<u>H</u>$_2$=CHCH=CHCH$_2$CH$_3$)Ru Compound Represented by Formula 3: (p-cymene)(1,5-hexadiene)Ru,
[CH$_3$C$_6$H$_4$CH(CH$_3$)$_2$](CH$_2$=CHCH$_2$—CH$_2$CH=CH$_2$)Ru
δ4.505 (m, 4H, [CH$_3$C$_6$<u>H</u>$_4$CH(CH$_3$)$_2$](CH$_2$=CHCH$_2$—CH$_2$CH=CH$_2$)Ru,
δ3.425 (m, 2H, [CH$_3$C$_6$H$_4$CH(CH$_3$)$_2$](CH$_2$=C<u>H</u>CH$_2$—CH$_2$C<u>H</u>=CH$_2$)Ru,
δ2.235 (m, 2H, [CH$_3$C$_6$H$_4$CH(CH$_3$)$_2$](CH$_2$=CHCH$_2$—CH$_2$CH=C<u>H</u>$_2$)Ru,
δ2.227 (d, 2H, [CH$_3$C$_6$H$_4$CH(CH$_3$)$_2$](C<u>H</u>$_2$=CHCH$_2$—CH$_2$CH=CH$_2$)Ru,
δ2.133 (m, 1H, [CH$_3$C$_6$H$_4$C<u>H</u>(CH$_3$)$_2$](CH$_2$=CHCH$_2$—CH$_2$CH=CH$_2$)Ru,
δ1.924 (m, 2H, [CH$_3$C$_6$H$_4$CH(CH$_3$)$_2$](CH$_2$=CHCH$_2$—C<u>H$_2$</u>CH=CH$_2$)Ru,
δ1.844 (s, 3H, [C<u>H$_3$</u>C$_6$H$_4$CH(CH$_3$)$_2$](CH$_2$=CHCH$_2$—CH$_2$CH=CH$_2$)Ru,
δ1.512 (d, 2H, [CH$_3$C$_6$H$_4$CH(CH$_3$)$_2$](CH$_2$=CHCH$_2$—CH$_2$CH=C<u>H</u>$_2$)Ru,
δ1.118 (d, 6H, [CH$_3$C$_6$H$_4$CH(C<u>H$_3$</u>)$_2$](CH$_2$=CHCH$_2$—CH$_2$CH=CH$_2$)Ru

Examples 2 to 4

Ruthenium precursor compositions having the composition shown in Table 1 below were each prepared in the same manner as in Example 1, except that the temperature and the number of distillation under a reduced pressure were varied.

Example 5

30 g (0.048 mole) of [RuCl$_2$(p-cymene)]$_2$ and 14.2 g (0.192 mole) of Li$_2$CO$_3$ were mixed with 400 ml of 2-propanol in a flame-dried 1,000-ml Schlenk flask to prepare a suspension.

23.7 g (0.288 mole) of 1,5-hexadiene was slowly added to the suspension, and the mixture was subjected to a reflux reaction (first reflux reaction) for 24 hours and then cooled to room temperature. 20.4 g (0.192 mole) of Na$_2$CO$_3$ was added to the resultant, and the reaction solution was further subjected to a reflux reaction (second reflux reaction) for 48 hours to complete the reaction.

Upon completion of the reaction, the solvent and volatile by-products were removed under a reduced pressure, and the resultant was then extracted using 500 ml of n-hexane. The n-hexane extract was filtered through a Celite pad and a glass frit, and the filtrate thus obtained was subjected to solvent removal and distillation under a reduced pressure to obtain a ruthenium precursor composition comprising an orange liquid mixture (p-cymene)(2,4-hexadiene)Ru represented by Formula 1 and an orange liquid mixture (p-cymene)(1,3-hexadiene)Ru represented by Formula 2.

$^1$H-NMR (400 MHz, C$_6$D$_6$, 25° C.):

Compound Represented by Formula 1: (p-cymene)(2,4-hexadiene)Ru,
[CH$_3$C$_6$H$_4$CH(CH$_3$)$_2$](CH$_3$CH=CH—CH=CHCH$_3$)Ru
δ4.668 (m, 4H, [CH$_3$C$_6$<u>H</u>$_4$CH(CH$_3$)$_2$](CH$_3$CH=CH—CH=CHCH$_3$)Ru),
δ4.330 (m, 2H, [CH$_3$C$_6$H$_4$CH(CH$_3$)$_2$](CH$_3$C<u>H</u>=CH—CH=CHCH$_3$)Ru),
δ2.338 (m, 1H, [CH$_3$C$_6$H$_4$C<u>H</u>(CH$_3$)$_2$](CH$_3$CH=CH—CH=CHCH$_3$)Ru),
δ2.013 (s, 3H, [C<u>H$_3$</u>C$_6$H$_4$CH(CH$_3$)$_2$](CH$_3$CH=CH—CH=CHCH$_3$)Ru),
δ1.371 (d, 6H, [CH$_3$C$_6$H$_4$CH(C<u>H$_3$</u>)$_2$](CH$_3$CH=CH—CH=CHCH$_3$)Ru),
δ1.147 (d, 6H, [CH$_3$C$_6$H$_4$CH(CH$_3$)$_2$](CH$_3$CH=CH—CH=CHC<u>H$_3$</u>)Ru),
δ0.739 (m, 2H, [CH$_3$C$_6$H$_4$CH(CH$_3$)$_2$](CH$_3$C<u>H</u>=CH—CH=C<u>H</u>CH$_3$)Ru), Compound Represented by Formula 2: (p-cymene)(1,3-hexadiene)Ru,
[CH$_3$C$_6$H$_4$CH(CH$_3$)$_2$](CH$_2$=CHCH=CHCH$_2$CH$_3$)Ru
δ4.983 (m, 1H, [CH$_3$C$_6$<u>H</u>$_4$CH(CH$_3$)$_2$](CH$_2$=CHCH=CHCH$_2$CH$_3$)Ru,
δ4.835 (m, 2H, [CH$_3$C$_6$<u>H</u>$_4$CH(CH$_3$)$_2$](CH$_2$=CHCH=CHCH$_2$CH$_3$)Ru,
δ4.727 (m, 1H, [CH$_3$C$_6$<u>H</u>$_4$CH(CH$_3$)$_2$](CH$_2$=CHCH=CHCH$_2$CH$_3$)Ru,
δ4.603 (m, 1H, [CH$_3$C$_6$H$_4$CH(CH$_3$)$_2$](CH$_2$=C<u>H</u>CH=CHCH$_2$CH$_3$)Ru,
δ4.418 (m, 1H, [CH$_3$C$_6$H$_4$CH(CH$_3$)$_2$](CH$_2$=CHC<u>H</u>=CHCH$_2$CH$_3$)Ru,
δ2.302 (m, 1H, [CH$_3$C$_6$H$_4$C<u>H</u>(CH$_3$)$_2$](CH$_2$=CHCH=CHCH$_2$CH$_3$)Ru,
δ1.969 (s, 3H, [[C<u>H$_3$</u>C$_6$H$_4$CH(CH$_3$)$_2$](CH$_2$=CHCH=CHCH$_2$CH$_3$)Ru,
δ1.758 (d, 1H, [CH$_3$C$_6$H$_4$CH(CH$_3$)$_2$](C<u>H</u>$_2$=CHCH=CHCH$_2$CH$_3$)Ru,
δ1.703 (m, 1H, [CH$_3$C$_6$H$_4$CH(CH$_3$)$_2$](CH$_2$=CHCH=CHC<u>H</u>$_2$CH$_3$)Ru,
δ1.401 (m, 1H, [CH$_3$C$_6$H$_4$CH(CH$_3$)$_2$](CH$_2$=CHCH=CHC<u>H$_2$</u>CH$_3$)Ru, δ1.120 (t, 3H, (CH$_2$=CHCH=CHCH$_2$CH$_3$)Ru, [CH$_3$C$_6$H$_4$CH(CH$_3$)$_2$]
δ1.098 (m, 6H, (CH$_2$=CHCH=CHCH$_2$CH$_3$)Ru, [CH$_3$C$_6$H$_4$CH(CH$_3$)$_2$]
δ0.726 (m, 1H, (CH$_2$=CHCH=CHCH$_2$CH$_3$)Ru, [CH$_3$C$_6$H$_4$CH(CH$_3$)$_2$]
δ0.194 (d, 1H, (CH$_2$=CHCH=CHCH$_2$CH$_3$)Ru [CH$_3$C$_6$H$_4$CH(CH$_3$)$_2$]

Compound Represented by Formula 3: Not Observed.

The contents of the compound represented by Formula 1, the compound represented by Formula 2, and the compound represented by Formula 3 contained in each of the ruthenium precursor compositions prepared in Examples 1 to 5 are summarized in Table 1 below.

TABLE 1

|  | Compound represented by Formula 1 (% by weight) | Compound represented by Formula 2 (% by weight) | Compound represented by Formula 3 (% by weight) |
| --- | --- | --- | --- |
| Ex. 1 | 22.9 | 22.0 | 55.1 |
| Ex. 2 | 36.0 | 34.1 | 29.9 |
| Ex. 3 | 43.3 | 36.4 | 20.3 |
| Ex. 4 | 50.8 | 39.3 | 9.9 |
| Ex. 5 | 57.9 | 42.1 | 0 |

Unit: Integral ratio of NMR peaks (the total sum of integral values of NMR peaks is 100%)
Here, since the compounds represented by Formulae 1 to 3 are three isomers having the same molecular weight, the integral ratio of NMR peaks is expressed as % by weight.

Evaluation Example 1: Evaluation of Dynamic Thermal Stability

The ruthenium precursor composition prepared in Example 1 was evaluated for dynamic thermal stability under the conditions shown in Table 2 below.

TABLE 2

|  | Conditions |
| --- | --- |
| MFC value (sccm) | 200 |
| Source canister temp. (° C.) | 120 |
| Recovery canister cooling temp. (° C.) | −76 (dry ice) |
| Canister connector line temp. (° C.) | 130 |
| Vaporization time (hour) | 0-168 hours (week 1) |
|  | 169-336 hours (week 2) |
| Instrument name | NMR (Varian MR-400) |

Specifically, 50 g of the ruthenium precursor composition was placed in a stainless-steel canister and heated to a temperature of 120° C. under vacuum. The stainless-steel canister containing the ruthenium precursor composition vaporized by flowing an argon carrier gas at a flow rate of 200 sccm. The vapor was collected in a stainless-steel canister cooled to −76° C. The composition vaporized for the first 7 days (0-168 hours) was collected to a first canister cooled to −76° C., and the composition vaporized from the 8$^{th}$ to 14$^{th}$ days (168-336 hours) was collected to a second canister cooled to −76° C. The unheated composition (week 0), the vapor collected in the first canister (week 1), and the vapor collected in the second canister (week 2) were each measured for a $^1$H-NMR (400 MHz, C$_6$D$_6$, 25° C.) spectra. The peak areas were compared relative to 100% as the total sum of NMR peak areas at 2.01 ppm (Formula 1), 1.97 ppm (Formula 2), 1.95 ppm (by-product A), 1.86 ppm (by-product B), and 1.84 ppm (Formula 3).

The results are shown in Table 3.

TABLE 3

|  | Temp. (° C.) | Time (week) | Compound represented by Formula 1 | Compound represented by Formula 2 | Compound represented by Formula 3 | By-product A | By-product B |
| --- | --- | --- | --- | --- | --- | --- | --- |
| Ex. 1 | Room temp. (% by weight) | 0 | 22.9 | 22 | 55.1 | N.D | N.D |
|  | 120 | 1 | 30.5 | 26.5 | 28.7 | 9.9 | 4.4 |
|  |  | 2 | 29 | 25.7 | 20.6 | 16.7 | 8 |

N.D: not detected

Unit: Integral ratio of NMR peaks (the total sum of integral values of NMR peaks is 100%)

Here, since the compounds represented by Formulae 1 to 3 are three isomers having the same molecular weight in the composition at room temperature containing no by-products, the integral ratio of NMR peaks represents the weight percent.

Evaluation Example 2: Evaluation of Static Thermal Stability

The ruthenium precursor compositions prepared in Examples 1 to 5 were each evaluated for static thermal stability under the conditions shown in Table 4 below.

TABLE 4

| Conditions | |
| --- | --- |
| Raw material weight (g) | 1 |
| Oven temp. (° C.) | 110 |
| | 120 |
| Heating time (hour) | 0-168 hours (week 1) |
| | 0-336 hours (week 2) |
| Instrument type | NMR (Varian MR-400) |

Specifically, 1 g of each of the ruthenium precursor compositions of Examples 1 to 5 was placed in a sealed stainless-steel canister and heated for 7 days and 14 days in an oven heated to 110° C. and 120° C., respectively. The heated ruthenium precursor compositions of Examples 1 to 5 were each cooled to room temperature and measured by $^1$H-NMR (400 MHz, $C_6D_6$, 25° C.). The peak areas were compared relative to 100% as the sum of NMR peaks at 2.01 ppm (Formula 1), 1.97 ppm (Formula 2), 1.95 ppm (by-product A), 1.86 ppm (by-product B), and 1.84 ppm (Formula 3).

The results are shown in Table 5.

TABLE 5

| | Temp. (° C.) | Time (week) | Compound represented by Formula 1 | Compound represented by Formula 2 | Compound represented by Formula 3 | By-product A | By-product B |
| --- | --- | --- | --- | --- | --- | --- | --- |
| Ex. 1 | Room temp. (% by weight) | 0 | 22.9 | 22.0 | 55.1 | N.D | N.D |
| | 110 | 1 | 22.8 | 20.8 | 47.5 | 6.8 | 2.1 |
| | | 2 | 23.2 | 20.7 | 42.0 | 9.9 | 4.1 |
| | 120 | 1 | 25.4 | 21.8 | 35.6 | 11.0 | 6.2 |
| | | 2 | 26.0 | 23.3 | 21.4 | 18.3 | 11.0 |
| Ex. 2 | Room temp. (% by weight) | 0 | 36.0 | 34.1 | 29.9 | N.D | N.D |
| | 110 | 1 | 37.6 | 30.5 | 26.0 | 3.2 | 2.7 |
| | | 2 | 38.6 | 30.4 | 23.9 | 4.4 | 2.7 |
| | 120 | 1 | 38.6 | 30.7 | 12.0 | 11.6 | 7.1 |
| | | 2 | 38.3 | 31.4 | 11.3 | 11.2 | 7.8 |
| Ex. 3 | Room temp. (% by weight) | 0 | 43.3 | 36.4 | 20.3 | N.D | N.D |
| | 110 | 1 | 43.6 | 34.7 | 17.3 | 3.6 | 0.8 |
| | | 2 | 45.0 | 33.6 | 15.9 | 3.8 | 1.7 |
| | 120 | 1 | 45.4 | 33.1 | 7.5 | 8.4 | 5.6 |
| | | 2 | 45.8 | 33.0 | 6.9 | 8.0 | 6.3 |
| Ex. 4 | Room temp. (% by weight) | 0 | 50.8 | 39.3 | 9.9 | N.D | N.D |
| | 110 | 1 | 50.5 | 38.2 | 8.6 | 2.1 | 0.6 |
| | | 2 | 51.4 | 37.5 | 8.8 | 1.7 | 0.6 |
| | 120 | 1 | 51.4 | 37.6 | 4.6 | 4.3 | 2.1 |
| | | 2 | 51.7 | 37.3 | 4.2 | 4.3 | 2.5 |
| Ex. 5 | Room temp. (% by weight) | 0 | 57.9 | 42.1 | N.D | N.D | N.D |
| | 110 | 1 | 58.1 | 41.9 | N.D | N.D | N.D |
| | | 2 | 58.6 | 41.4 | N.D | N.D | N.D |
| | 120 | 1 | 58.3 | 41.7 | N.D | N.D | N.D |
| | | 2 | 58.8 | 41.2 | N.D | N.D | N.D |

N.D: not detected

Unit: Integral ratio of NMR peaks (the total sum of integral values of NMR peaks is 100%)

Here, since the compounds represented by Formulae 1 to 3 are three isomers having the same molecular weight in the composition at room temperature containing no by-products, the integral ratio of NMR peaks represents the weight percent.

As can be seen from Table 5, in the present invention, it was possible to control the ruthenium precursor compositions of Examples 1 to 5, depending on the purpose, such that the compound represented by Formula 1, the compound represented by Formula 2, and the compound represented by Formula 3 each had a specific content.

In addition, it was confirmed that the thermal stability of the ruthenium precursor composition significantly varied depending on its composition.

Specifically, in the ruthenium precursor compositions of Examples 1 to 5, the lower the content of the compound represented by Formula 3, the more thermally stable the ruthenium precursor composition. Thus, there was little change in the composition of the compounds represented by Formulae 1 to 3 even at a temperature of 110° C. and 120° C., and the production rate of by-products A and B was low.

In particular, when the compound of Formula 3 was not present (0% by weight), it was very thermally stable even after 2 weeks at room temperature as well as at 110° C. and 120° C., respectively. Thus, there was little change in the composition of the compounds of Formulae 1 and 2, and no by-products were formed.

Figure 1:
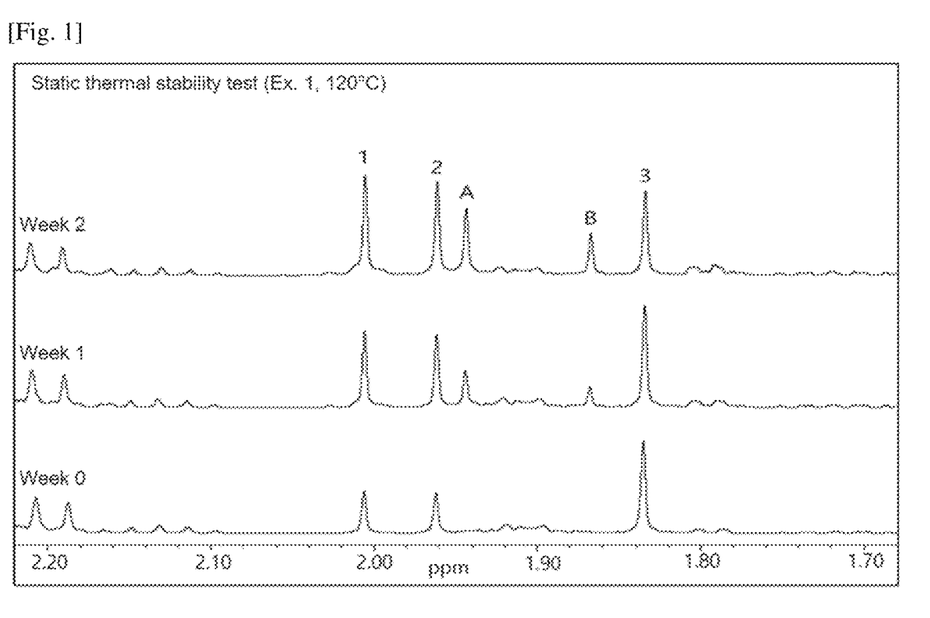
FIG. 1 is a graph of the results of a static thermal stability test measured using NMR at 120° C. for the ruthenium precursor composition of Example 1 of the present invention.
Figure 2:
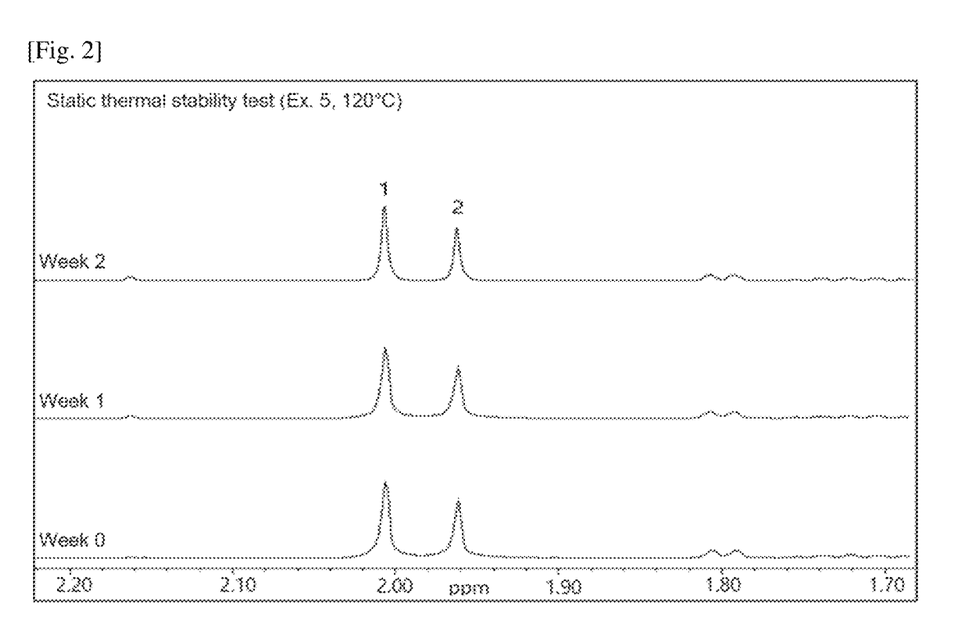
FIG. 2 is a graph of the results of a static thermal stability test measured using NMR at 120° C. for the ruthenium precursor composition of Example 5 of the present invention.

Meanwhile, NMR spectra of the results of static thermal stability tests of the ruthenium precursor compositions of Examples 1 and 5 are shown in FIGS. 1 and 2, respectively.

As can be seen from FIG. 1, in the NMR analysis of the ruthenium precursor composition of Example 1, peaks were observed for the compound represented by Formula 1 at about 2.01 ppm, the compound represented by Formula 2 at about 1.97 ppm, and the compound represented by Formula 3 at about 1.84 ppm. In addition, peaks for the components corresponding to by-products A and B in Table 5 appeared at both 1.95 ppm and 1.86 ppm.

On the other hand, as can be seen from FIG. 2, in the NMR analysis of the ruthenium precursor composition of Example 5, peaks were observed for the compound represented by Formula 1 at about 2.01 ppm and the compound represented by Formula 2 at about 1.97 ppm, while no peak for the compound represented by Formula 3 was observed at about 1.84 ppm. In addition, peaks for the components corresponding to by-products A and B in Table 5 did not appear at both 1.95 ppm and 1.86 ppm. As a result, it was confirmed that the ruthenium precursor composition of Example 5 did not contain the compound represented by Formula 3 and did not contain components corresponding to by-products A and B in Table 5.

The invention claimed is:

1. A ruthenium precursor composition, which comprises 20% to 60% by weight of a compound represented by the following Formula 1, 20% to 50% by weight of a compound represented by the following Formula 2, and 0% to 55% by weight of a compound represented by the following Formula 3, based on the total weight of the ruthenium precursor composition:

[Formula 1]

[Formula 2]

[Formula 3]

2. The ruthenium precursor composition of claim 1, which comprises 30% to 60% by weight of the compound represented by the following Formula 1, 30% to 50% by weight of the compound represented by the following Formula 2, and 0% to 25% by weight of the compound represented by the following Formula 3, based on the total weight of the ruthenium precursor composition.

3. The ruthenium precursor composition of claim 1, wherein the ratio of the total content of the compound represented by Formula 1 and the compound represented by Formula 2 to the content of the compound represented by Formula 3, based on weight, is 100:0 to 80:20.

4. The ruthenium precursor composition of claim 1, which comprises the compound represented by Formula 3 in an amount of 10% by weight or less based on the total weight of the ruthenium precursor composition.

5. The ruthenium precursor composition of claim 1, which comprises the compound represented by Formula 3 in an amount of 5% by weight or less based on the total weight of the ruthenium precursor composition.

6. The ruthenium precursor composition of claim 1, which does not comprise the compound represented by Formula 3.

7. The ruthenium precursor composition of claim 1, wherein the weight ratio of the compound represented by Formula 1 to the compound represented by Formula 2 is 7:3 to 5:5.

8. The ruthenium precursor composition of claim 1, wherein no NMR peak appears at 1.95 ppm, 1.86 ppm, or both, when the ruthenium precursor composition is measured by $^1$H-NMR (400 MHz, $C_6D_6$, 25° C.) at room temperature.

9. A method for preparing a ruthenium precursor composition, which comprises subjecting a compound represented by the following Formula 4 to a reaction with an alkali metal carbonate salt represented by the following Formula 5 and 1,5-hexadiene in an organic solvent, wherein the ruthenium precursor composition comprises 20% to 60% by weight of a compound represented by the following Formula 1, 20% to 50% by weight of a compound represented by the following Formula 2, and 0% to 55% by weight of a compound represented by the following Formula 3, based on the total weight of the ruthenium precursor composition:

[Formula 1]

[Formula 2]

[Formula 3]

[Formula 4]

[Formula 5]
M₂CO₃ in the above formulae, M is selected from the group consisting of Li, Na, and K, and X is selected from the group consisting of Cl, Br, and I.

10. The method for preparing a ruthenium precursor composition of claim 9, wherein the reaction comprises a reflux reaction.

11. The method for preparing a ruthenium precursor composition of claim 10, wherein the reflux reaction is carried out at 60 to 160° C. for 10 hours to 100 hours.

12. The method for preparing a ruthenium precursor composition of claim 9, which further comprises, after the reaction, carrying out distillation at a reduced pressure of 0.1 Torr to 1 Torr and 50° C. to 200° C.

13. The method for preparing a ruthenium precursor composition of claim 9, wherein the reaction comprises a first reflux reaction of the compound represented by Formula 4 with a first alkali metal carbonate salt and 1,5-hexadiene in the organic solvent; and a second reflux reaction of the resultant with a second alkali metal carbonate salt.

14. The method for preparing a ruthenium precursor composition of claim 13, wherein the first reflux reaction is carried out at 60 to 160° C. for 10 hours to 40 hours, and the second reflux reaction is carried out at 60 to 160° C. for 10 hours to 60 hours.

15. The method for preparing a ruthenium precursor composition of claim 13, wherein the first alkali metal carbonate salt comprises $Li_2CO_3$, and the second alkali metal carbonate salt comprises $Na_2CO_3$.

16. The method for preparing a ruthenium precursor composition of claim 13, wherein the molar ratio of the first alkali metal carbonate salt and the second alkali metal carbonate salt is 1:0.2 to 3.0.

17. The method for preparing a ruthenium precursor composition of claim 13, which further comprises cooling the resultant to room temperature before the second reflux reaction.

18. The method for preparing a ruthenium precursor composition of claim 9, wherein the molar ratio of the compound represented by Formula 4, the alkali metal carbonate salt, and 1,5-hexadiene is 1:2 to 10:1 to 8.

19. The method for preparing a ruthenium precursor composition of claim 9, wherein the organic solvent comprises a primary alcohol or a secondary alcohol having 5 carbon atoms or less.

20. A method for forming a ruthenium-containing film, which comprises preparing a ruthenium precursor composition; and forming a ruthenium-containing film using the ruthenium precursor composition, wherein the ruthenium precursor composition is prepared by subjecting a compound represented by the following Formula 4 to a reaction with an alkali metal carbonate salt represented by the following Formula 5 and 1,5-hexadiene in an organic solvent and comprises 20% to 60% by weight of a compound represented by the following Formula 1, 20% to 50% by weight of a compound represented by the following Formula 2, and 0% to 55% by weight of a compound represented by the following Formula 3, based on the total weight of the ruthenium precursor composition:

[Formula 1]

[Formula 2]

[Formula 3]

-continued

M₂CO₃

[Formula 4]

[Formula 5]

in the above formulae, M is selected from the group consisting of Li, Na, and K, and X is selected from the group consisting of Cl, Br, and I.

21. The method for forming a ruthenium-containing film of claim 20, wherein the ruthenium-containing film is deposited by chemical vapor deposition or atomic layer deposition (ALD), and the deposition is carried out in a temperature range of room temperature to 550° C.

22. A ruthenium-containing film, which is formed using the ruthenium precursor composition of claim 1.

* * * * *